(12) United States Patent
Huang et al.

(10) Patent No.: US 11,658,249 B2
(45) Date of Patent: May 23, 2023

(54) MOS TRANSISTORS CAPABLE OF BLOCKING REVERSE CURRENT

(71) Applicant: Leadtrend Technology Corporation, Zhubei (TW)

(72) Inventors: Tsung-Yi Huang, Zhubei (TW); Chun-Ming Hsu, Zhubei (TW); Chiung-Fu Huang, Zhubei (TW)

(73) Assignee: LEADTREND TECHNOLOGY CORPORATION, Zhubei (TW)

( * ) Notice: Subject to any disclaimer, the term of this patent is extended or adjusted under 35 U.S.C. 154(b) by 214 days.

(21) Appl. No.: 17/038,159

(22) Filed: Sep. 30, 2020

(65) Prior Publication Data

US 2021/0119061 A1 Apr. 22, 2021

(30) Foreign Application Priority Data

Oct. 16, 2019 (TW) .................................. 108137167

(51) Int. Cl.
*H01L 29/872* (2006.01)
*H01L 29/78* (2006.01)
*H02M 3/335* (2006.01)
*H02M 7/217* (2006.01)

(52) U.S. Cl.
CPC ........ *H01L 29/872* (2013.01); *H01L 29/7833* (2013.01); *H02M 7/217* (2013.01)

(58) Field of Classification Search
CPC ............... H01L 29/872; H01L 29/7833; H01L 27/0629; H01L 29/0619; H01L 29/0623; H01L 29/0653; H01L 29/0649; H01L 29/7816; H02M 3/33592; H02M 1/083; H02M 7/217; Y02B 70/10
See application file for complete search history.

(56) References Cited

U.S. PATENT DOCUMENTS

| | | | |
|---|---|---|---|
| 2015/0214850 A1* | 7/2015 | Lin | H02M 1/08 363/21.14 |
| 2016/0190947 A1* | 6/2016 | Shein | H02M 3/33592 363/21.14 |
| 2018/0034261 A1* | 2/2018 | Lee | H02H 3/247 |
| 2018/0190808 A1* | 7/2018 | Chiu | H02M 7/217 |
| 2020/0220005 A1* | 7/2020 | Huang | H01L 29/0692 |

* cited by examiner

*Primary Examiner* — Shahed Ahmed
*Assistant Examiner* — Khatib A Rahman
(74) *Attorney, Agent, or Firm* — McClure, Qualey & Rodack, LLP (57) ABSTRACT

A high-voltage semiconductor device integrates a MOS transistor with a Schottky barrier diode. The MOS transistor has a semiconductor substrate of a first conduction type, a well of a second conduction, a body of the first conduction type, and a doped source of the second type. A control gate formed above the body controls electric connection between the doped source and the well. The Schottky barrier diode has a metal, functioning to be an anode of the Schottky barrier diode and contacting the well to form a Schottky barrier junction therebetween.

10 Claims, 7 Drawing Sheets

MOS TRANSISTORS CAPABLE OF BLOCKING REVERSE CURRENT

CROSS-REFERENCE TO RELATED APPLICATION

This application claims priority to and the benefit of Taiwan Application Series Number 108137167 filed on Oct. 16, 2019, which is incorporated by reference in its entirety.

BACKGROUND

The present disclosure relates generally to a high-voltage semiconductor device in use of a synchronous rectification controller, and, more particularly, to a high-voltage semiconductor device integrating a Schottky barrier diode with a MOS transistor to stop reverse current when reversely biased.

High-voltage semiconductor devices generally refer to those capable of sustaining a voltage more than 50V. In view of applications, high-voltage semiconductor devices can be used for switching loads, transferring power between different voltage levels, and/or acting as power devices in power amplifiers.

A high-voltage metal-semiconductor-oxide field effect transistor (MOSFET), one of high-voltage semiconductor devices, basically need be equipped with a very high drain-to-source breakdown voltage. It might need to meet more requirements based on the specific purposes it is designed for. For example, some high-voltage metal-semiconductor-oxide field effect transistors must have low gate-to-source capacitance, specifically suitable for high-speed switching.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified. These drawings are not necessarily drawn to scale. Likewise, the relative sizes of elements illustrated by the drawings may differ from the relative sizes depicted.

The invention can be more fully understood by the subsequent detailed description and examples with references made to the accompanying drawings, wherein:

FIG. 2A demonstrates a top view and a cross-sectional view of high-voltage semiconductor device 100a;

FIG. 2B demonstrates the top view and another cross-sectional view of high-voltage semiconductor device 100a;

DETAILED DESCRIPTION

One embodiment of the invention provides a high-voltage semiconductor device having a MOS transistor and a Schottky barrier diode integrated together on a semiconductor substrate. The MOS transistor and the Schottky barrier diode share a common semiconductor layer used as the drain of the MOS transistor and the cathode of the Schottky barrier diode. When the Schottky barrier diode is forward biased, the MOS transistor can sustain a high drain-to-source voltage. When the Schottky barrier diode is reversely biased, the Schottky barrier diode blocks a reverse current, which otherwise flows through forward-biased diodes parasitic within the MOS transistor.

In this specification, a semiconductor is N-type if the majority of charge carriers therein are electrons. In the opposite, a semiconductor is P-type if the majority of charge carriers therein are holes. P-type is the opposite of N-type.

Figure 1:
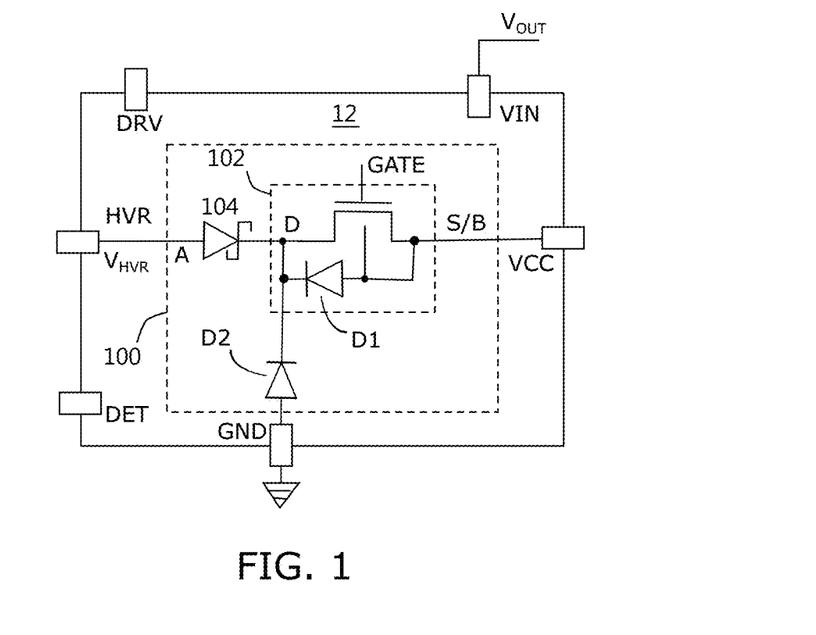
FIG. 1 demonstrates synchronous rectification controller 12 according to embodiments of the invention.

FIG. 1 demonstrates synchronous rectification controller 12 according to embodiments of the invention, in a form of a packaged integrated circuit. As demonstrated in FIG. 1, synchronous rectification controller 12 has, but is not limited to have, drive node DRV, high-voltage node HVR, detection node DET, input power voltage node VIN, operating power voltage node VCC, and ground node GND, wherein each node could be a pin of the packaged integrated circuit.

Synchronous rectification controller 12 has high-voltage semiconductor device 100, formed on for example a semiconductor chip and made by semiconductor manufacture processes. High-voltage semiconductor device 100 in FIG. 1 integrates MOS transistor 102 and Schottky barrier diode 104 on a semiconductor ship (not shown). MOS transistor 102 is a N-type MOS transistor having its source and body electrically connected to each other, so its source and body are collectively referred to as source/body electrode S/B, which as shown in FIG. 1 is electrically connected to operating power voltage node VCC. Diode D1 is electrically connected between drain electrode D and source/body electrode S/B of MOS transistor 102, diode D2 between ground node GND and drain electrode D, and Schottky barrier diode 104 between drain electrode D and high-voltage node HVR. Anode A of Schottky barrier diode 104 is connected to high-voltage node HVR, and when the voltage at anode A is negative in comparison with the voltage at ground node GND Schottky barrier diode 104 blocks reverse currents that otherwise flow through diodes D1 and D2 and could burn out synchronous rectification controller 12.

Figure 2A:
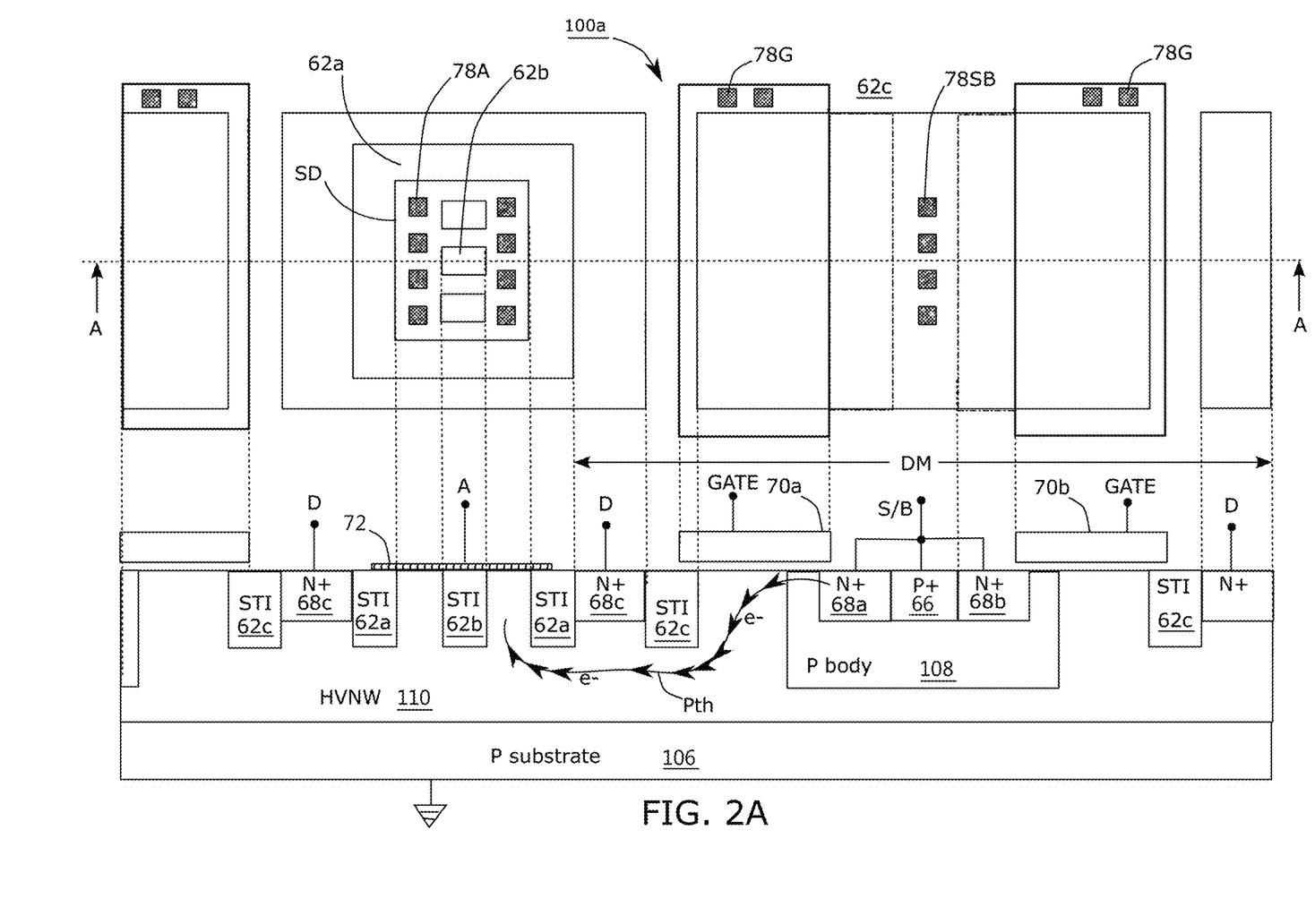
Figure 2B:
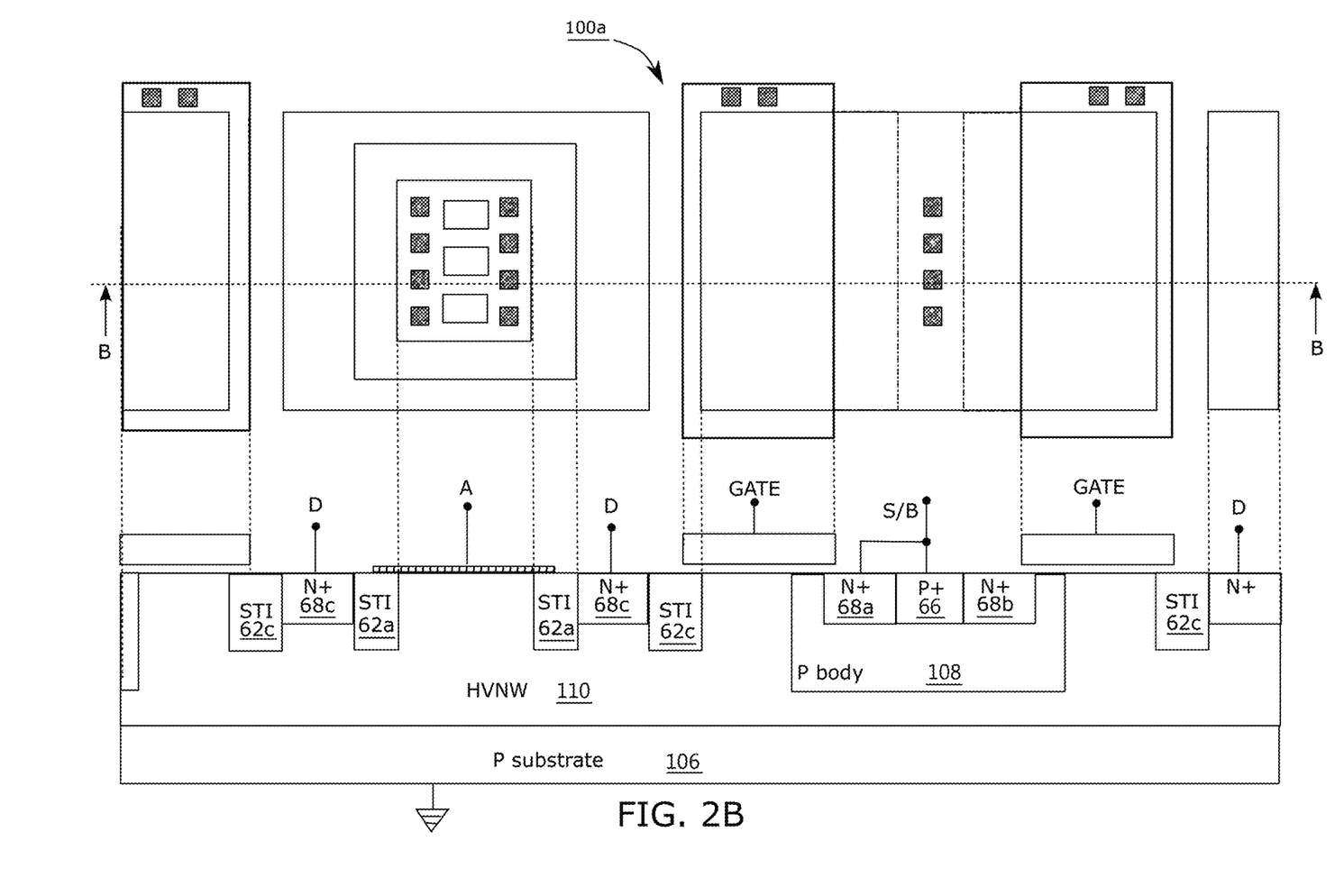

The top half of FIG. 2A demonstrates a top view of high-voltage semiconductor device 100a, and the bottom half a cross-sectional view across line AA in the top view. FIG. 2B, similar with FIG. 2A, shows the top view of high-voltage semiconductor device 100a in its top half, while the bottom half of FIG. 2B shows a cross-sectional view of line BB in the top view. Dashed lines in FIGS. 2A and 2B help explain the positional relationship between the structures or devices in these figures. High-voltage semiconductor device 100a exemplifies high-voltage semiconductor device 100 in embodiments of the invention.

In the top view, high-voltage semiconductor device 100a substantially includes two major regions: Schottky region SD and DMOS region DM, separated by isolation region 62a. Schottky region SD is surrounded by isolation region 62a, and is for constructing Schottky barrier diode 104 in FIG. 1. DMOS region DM ranges from an edge of isolation region 62a to the right edge of FIG. 2A, as shown in FIG. 2A, for constructing MOS transistor 102 in FIG. 1.

In light of the cross-sectional view in FIG. 2A, formed on the surface of P-type semiconductor substrate 106 is N-type deep well 110. Within DMOS region DM, P-type body 108 is formed on the surface of N-type deep well 110, and N-type heavily-doped sources 68a, 68b and P-type heavily-doped region 66 are on the surface of P-type body 108. Even though N-type heavily-doped sources 68a and 68b are separate in the cross-sectional view in FIG. 2A, they might belong to a common N-type heavily-doped source in a top view in one embodiment. In view of the top view of FIG. 2A, surrounded by isolation region 62c are a portion of N-type deep well 110, P-type body 108, N-type heavily-doped sources 68a, 68b, and P-type heavily-doped region 66. Control gate 70a, a patterned poly-silicon layer in one example, is formed above and electrically isolated from N-type heavily-doped source 68a, P-type body 108 and N-type deep well 110, while overlapping with a portion of isolation region 62c. Control gate 70b is formed over and electrically isolated from N-type heavily-doped source 68b, P-type body 108 and N-type deep well 110, while overlapping with a portion of isolation region 62c. Isolation region 62c surrounds N-type heavily-doped drain 68c, which surrounds isolation region 62a. N-type heavily-doped sources 68a, 68b and P-type heavily-doped region 66 electrically short to each other, functioning as source/body electrode S/B of MOS transistor 102. P-type heavily-doped region 66 helps N-type heavily-doped sources 68a, 68b electrically connect to P-type body 108. N-type heavily-doped drain 68c functions as drain electrode D of MOS transistor 102. Control gate 70a, functioning as gate electrode GATE of MOS transistor 102, controls the formation of a conductive channel thereunder electrically connecting N-type heavily-doped source 68a and N-type deep well 110. Interlayer connection, in form of metal layers, vias, and contact plugs for example, could electrically connect control gates 70a and 70b, to increase the driving ability of MOS transistor 102.

Even though N-type heavily-doped sources 68a, 68b, and N-type heavily-doped drain 68c are at different locations in the top view, they might experience the same manufacturing process at the same time and therefore share some common properties. For example, they have the same kind of dopants, the same impurity concentration, the same junction depth. Similarly, isolation regions 62a, 62b and 62c might experience the same manufacturing process at the same time and therefore have the same isolation-layer thickness according to embodiments of the invention. Control gates 70a and 70b might also experience the same manufacturing process at the same time and might share some common properties.

Schottky region SD, surrounded by isolation region 62a, includes in the top view of FIG. 2A three distinct isolation regions 62b according to embodiments of the invention. Formed over the surface of N-type deep well 110 within Schottky region SD is metal layer 72, functioning as anode A of Schottky barrier diode 104. Metal layer 72 contacts with N-type deep well 110 to form Schottky barrier junction, which provides current rectification. N-type deep well 110 functions as the cathode of Schottky barrier diode 104, and is also electrically connected to drain electrode D of MOS transistor 102. In other words, N-type deep well 110 is the common semiconductor layer used as drain electrode D of MOS transistor 102 and the cathode of Schottky barrier diode 104.

Metal layer 72 could include the silicide formed from a salicide process, and/or metal plugs that fill up contact holes. Within Schottky region SD, resist protect oxide (RPO) can be optionally formed. If Schottky region SD contains no RPO, Schottky barrier junction is formed by silicide contacting N-type deep well 110. In the opposite, if Schottky region SD contains RPO, Schottky barrier junction is formed by a metal plug contacting N-type deep well 110.

The distance between isolation regions 62a and 62b can be adjusted to tune the breakdown voltage of Schottky barrier diode 104. The closer the distance, the higher the breakdown voltage.

N-type heavily-doped drain 68c electrically floats on N-type deep well 110, meaning that there is no interlayer connection provided to N-type heavily-doped drain 68c to electrically connect it to a certain level of voltage. N-type heavily-doped drain 68c contacts, however, with N-type deep well 110, so it is electrically connected to N-type deep well 110, and could be influenced by N-type deep well 110 to have a certain level of voltage.

N-type deep well 110, P-type body 108, N-type heavily-doped sources 68a, 68b, P-type heavily-doped region 66, and N-type heavily-doped drain 68 all are formed on a common top surface of P-type semiconductor substrate 106, as shown in FIGS. 2A and 2B. Above the common top surface, control gates 70a, 70b and metal 72 are formed.

FIG. 2A also shows path Pth, through which electrons goes from N-type heavily-doped source 68a, through P-type body 108 and N-type deep well 110, to metal layer 72 when gate electrode GATE is properly biased. N-type heavily-doped drain 68c is useful in adjusting the location of path Pth and lowering the equivalent resistance of path Pth.

The top views in FIGS. 2A and 2B also demonstrate several metal plugs 78A, 78G, and 78SB, functioning as anode A of Schottky barrier diode 104, gate electrode GATE of MOS transistor 102, and source/body electrode S/B of MOS transistor 102, respectively.

When high-voltage semiconductor device 100a of FIGS. 2A and 2B embodies high-voltage semiconductor device 100 of FIG. 1, P-type semiconductor substrate 106 electrically connects to ground node GND, anode A to high-voltage node HVR, and source/body electrode S/B to operating power voltage node VCC. Diode D1 in FIG. 1 represents the PN junction between P-type body 108 and N-type deep well 110, and diode D2 the PN junction between P-type semiconductor substrate 106 and N-type deep well 110.

Figure 3:
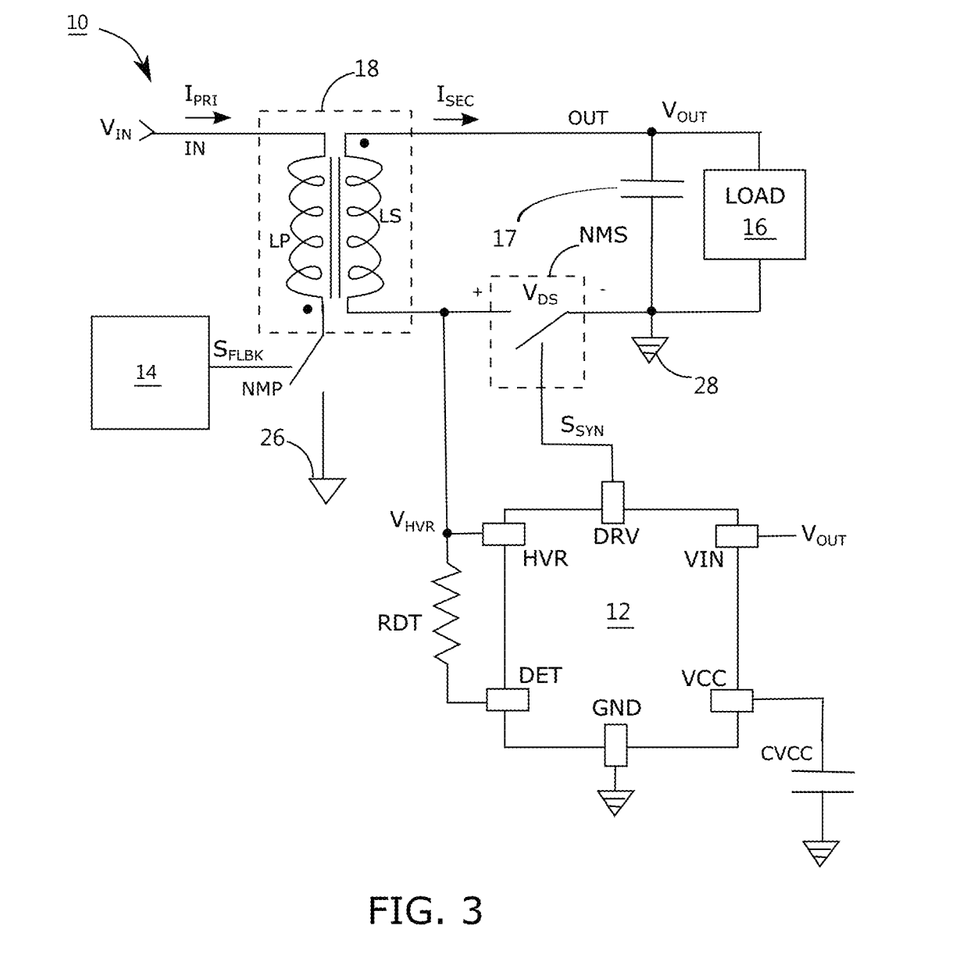
FIG. 3 shows power supply 10 which employs synchronous rectification controller 12 in FIG. 1.

FIG. 3 shows power supply 10 which employs synchronous rectification controller 12 in FIG. 1.

Power supply 10 includes transformer 18 having primary winding LP and secondary winding LS inductively coupling to each other and located at a primary side and a secondary side respectively. At the primary side, power controller 14 turns ON and OFF power switch NMP using signal $S_{FLBK}$ to control current $I_{PRI}$ flowing through primary winding LP. Induced current $I_{SEC}$ from secondary winding LS, rectified by synchronous rectification switch NMS controlled by synchronous rectification controller 12, charges output capacitor 17 to generate output voltage $V_{OUT}$ supplying power to load 16. Secondary winding LS is connected in series with synchronous rectification switch NMS.

Synchronous rectification controller 12 provides control signal $S_{SYN}$ at drive node DRV to turn ON and OFF synchronous rectification switch NMS, so as to control the electric connection between secondary winding LS and ground line 28 at the secondary side. To perform proper rectification, it is expected and designed that synchronous rectification switch NMS is turned ON, performing a short circuit between secondary winding LS and ground line 28, when channel voltage $V_{DS}$ of synchronous rectification switch NMS is negative. In the opposite, synchronous rectification switch NMS should be turned OFF when channel voltage $V_{DS}$ is positive, so that the energy stored at output voltage $V_{OUT}$ is not withdrawn by secondary winding LS.

High-voltage node HVR has signal $V_{HVR}$ and is electrically connected to the joint between secondary winding LS and synchronous rectification switch NMS, which provides a controllable channel between secondary winding LS and ground line 28. Connected between detection node DET and high-voltage node HRV is resistor RDT. Input power voltage node VIN receives output voltage $V_{OUT}$, and operating power voltage node VCC is electrically connected to operating power capacitor CVCC. Ground node GND is electrically connected to ground line 28.

Figure 4:
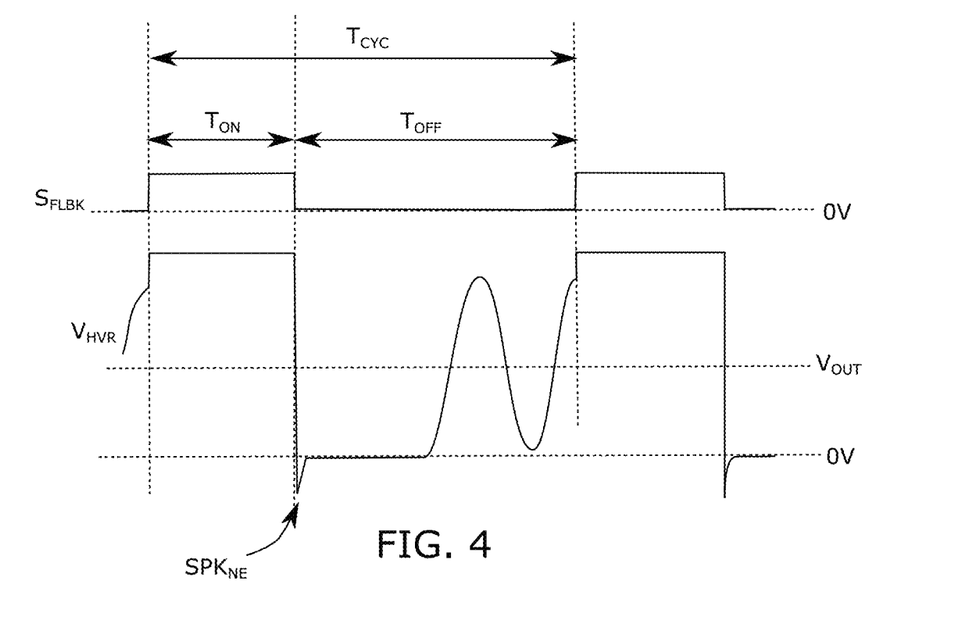
FIG. 4 illustrates waveforms of signal $S_{FLBK}$ at the primary side and signal $V_{HVR}$ at the secondary side in FIG. 3.

FIG. 4 illustrates waveforms of signal $S_{FLBK}$ at the primary side and signal $V_{HVR}$ at the secondary side in FIG. 3.

Signal $S_{FLBK}$ defines cycle time $T_{CYC}$, ON time $T_{ON}$ and OFF time $T_{OFF}$. Cycle time $T_{CYC}$ in FIG. 4 is the duration between two consecutive rising edges of signal $S_{FLBK}$, ON time $T_{ON}$ the duration when power switch NMP is ON, and OFF time $T_{OFF}$ the duration when power switch NMP is OFF. During ON time $T_{ON}$, signal $V_{HVR}$, whose voltage level reflects input voltage $V_{IN}$ in the meantime, is much higher than output voltage $V_{OUT}$. In the beginning of OFF time $T_{OFF}$, signal $V_{HVR}$ drops abruptly to have a large negative spike $SPK_{NE}$ due to some parasitic parameters. After that, as long as transformer 18 releases the electromagnetic power it stores, signal $V_{HVR}$ is slightly negative, and very close to 0V. After transformer 18 finishes releasing its stored power, signal $V_{HVR}$ vibrates or resonates until the next ON time $T_{ON}$ starts.

During ON time $T_{ON}$, synchronous rectification controller 12 could provide proper bias to gate electrode GATE to turn ON high-voltage semiconductor device 100, which in response drains some current from high-voltage node HRV to charge operating power capacitor CVCC connected to operating power voltage node VCC, so as to provide operating power that synchronous rectification controller 12 needs. High-voltage semiconductor device 100 should be capable of sustaining the high-voltage stress caused by signal $V_{HVR}$ during ON time $T_{ON}$.

During OFF time $T_{OFF}$, Schottky barrier diode 104 within synchronous rectification controller 12 is capable of blocking any reverse current which otherwise flows largely due the existence of negative spike $SPK_{NE}$. Supposed that Schottky barrier diode 104 does not exist and is replaced by a short circuit, negative spike $SPK_{NE}$ at signal $V_{HVR}$ forward biases diodes D1 and D2, which in response conducts huge reverse current flowing from ground node GND or operating power voltage node VCC to High-voltage node HRV, possibly burning out devices in synchronous rectification controller 12. Schottky barrier diode 104 is reversely biased when negative spike $SPK_{NE}$ appears, and stops the formation of the huge reverse current anyway.

Figure 5:
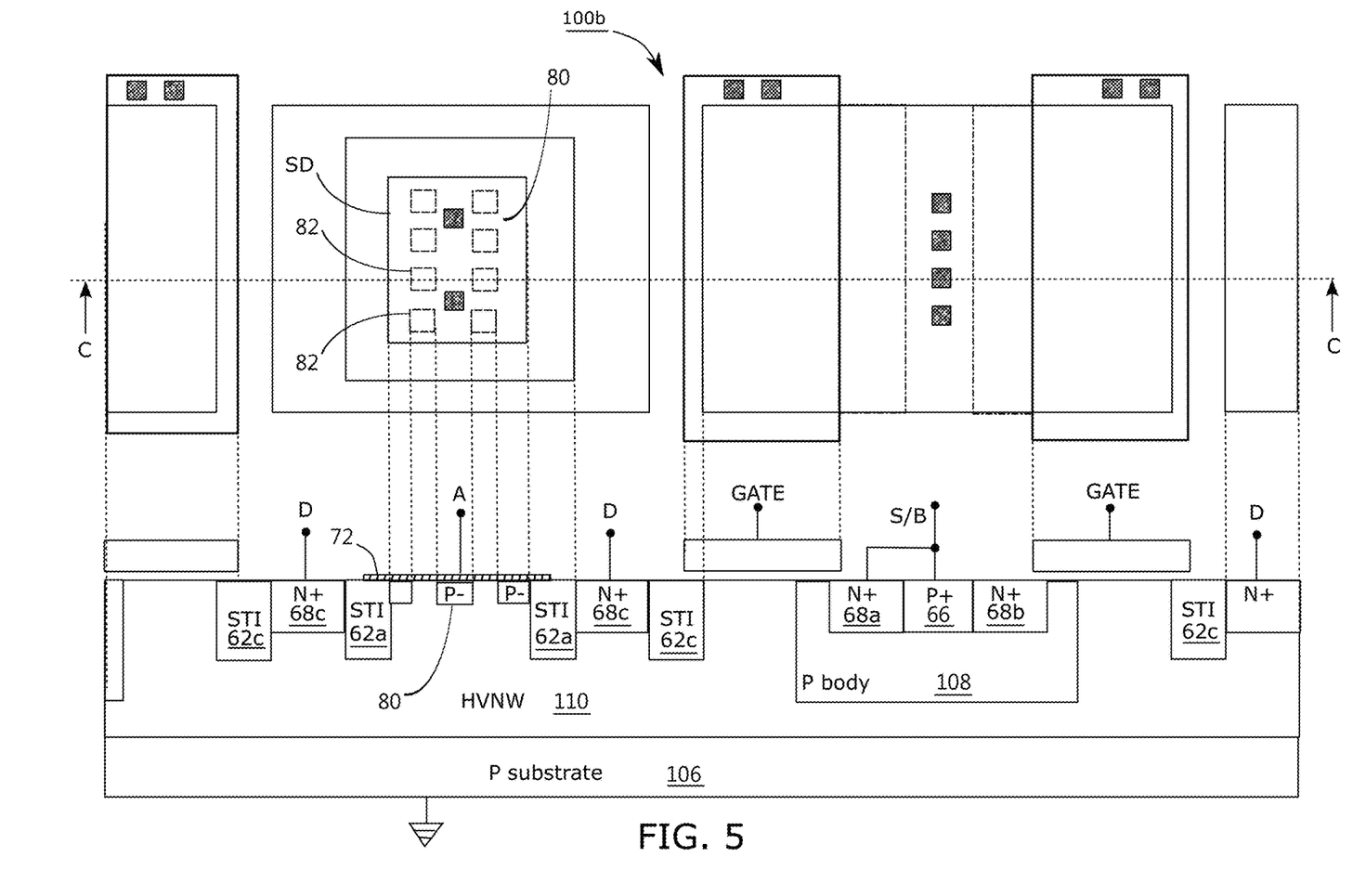
FIG. 5 demonstrates a top view and a cross-sectional view of high-voltage semiconductor device 100b.

FIG. 5 demonstrates a top view of high-voltage semiconductor device 100b, and a cross-sectional view across line CC in the top view. High-voltage semiconductor device 100b exemplifies high-voltage semiconductor device 100 according to some embodiments of the invention. FIGS. 5, 2A and 2B are alike, having similar or common parts or structures that are self-explanatory in view of the aforementioned teaching of high-voltage semiconductor device 100a.

High-voltage semiconductor device 100b in FIG. 5 differs from high-voltage semiconductor device 100a of FIGS. 2A and 2B only in the structure within Schottky region SD. Schottky region SD in FIGS. 2A and 2B has several isolation regions 62b, while Schottky region SD in FIG. 5 has no isolation regions 62b but P-type slightly-doped region 80 instead. P-type slightly-doped region 80 could be formed at the same time when forming the P-type slightly-doped regions of P-type MOS transistors with a lightly-doped drain (LDD) structure. In the top view of FIG. 5, P-type slightly-doped region 80 surrounds several voids 82 where the surface of N-type deep well 110 is reserved to not form P-type slightly-doped region 80. In the cross-sectional view of FIG. 5, metal layer 72 within voids 82 contacts with N-type deep well 110 to form Schottky barrier junction, while P-type slightly-doped region 80 contacts with N-type deep well 110 to form an PN junction. Schottky barrier junction accordingly is surrounded by P-type slightly-doped region 80. Voids 82 could be in one size, which determines the breakdown voltage of Schottky barrier diode 104. For example, the smaller voids 82 are, the easier the depletion region of the PN junction in proximity to voids 82 pinches, the higher the breakdown voltage of Schottky barrier diode 104 is.

Schottky region SD in FIG. 5 could optionally form with RPO. Schottky barrier junction within Schottky region SD of FIG. 5 could be constructed by silicide contacting N-type deep well 110 if Schottky region SD has no RPO. In the opposite, if Schottky region SD does contain RPO, Schottky barrier junction is formed by a metal plug contacting N-type deep well 110.

Figure 6:
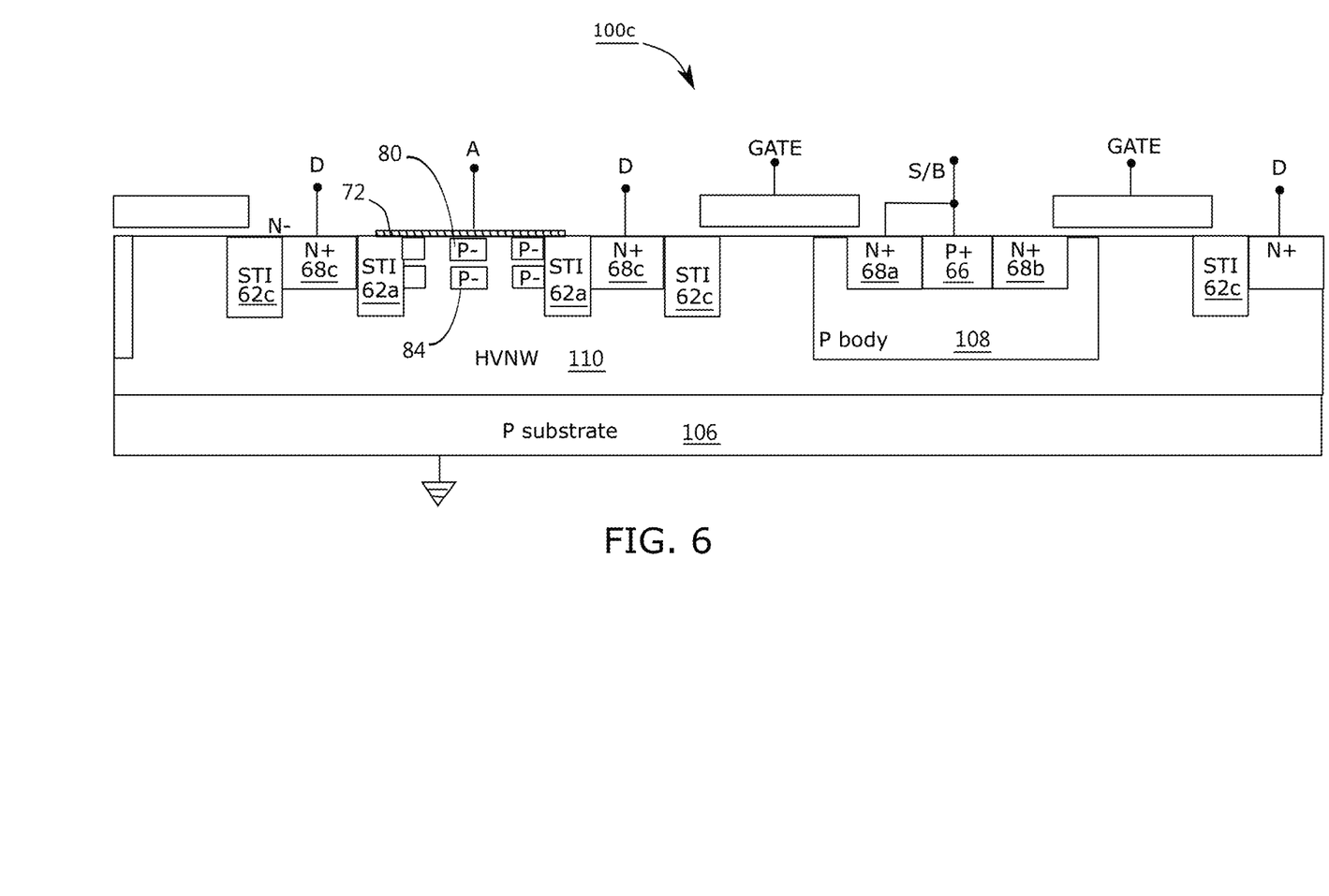
FIG. 6 demonstrates a cross-sectional view of high-voltage semiconductor device 100c.

FIG. 6 demonstrates a cross-sectional view of high-voltage semiconductor device 100c exemplifying high-voltage semiconductor device 100 according to some embodiments of the invention. FIGS. 6 and 5 are alike, having similar or common parts or structures that are self-explanatory in view of the aforementioned teaching of high-voltage semiconductor devices 100a and 100b. High-voltage semiconductor device 100c could have a top view the same with the one of high-voltage semiconductor device 100b. In comparison with high-voltage semiconductor device 100b in FIG. 5, high-voltage semiconductor device 100c in FIG. 6 additionally has P-type lightly-doped layer 84 buried within N-type deep well 110. P-type lightly-doped layer 84 positions substantially under and aligns with P-type slightly doped region 80. The existence of P-type lightly-doped layer 84 could further increase the breakdown voltage of Schottky barrier diode 104, because P-type lightly-doped layer 84 vertically deepens the depletion region of the PN junction under voids 82, so the maximum electric field between metal layer 72 and N-type deep well 110 is reduced. Schottky region SD in FIG. 6 could optionally form with RPO as well.

Isolation regions 62a, 62b and 62c are exemplified by shallow trench isolations (STI) according to embodiments of the invention, but this invention is not limited to however. Field oxidation, which oxides selected areas of a semiconductor surface to provide isolation between devices, could be employed to build up isolation regions 62a, 62b and 62c according to embodiments of the invention.

In the aforementioned embodiments, N-type heavily-doped source 68a, 68b, and N-type heavily-doped drain 68c are formed at the same time when drains and sources of N-type MOS transistors are formed. Similarly, P-type heavily-doped region 66 is formed at the same time when drains and sources of P-type MOS transistors are formed.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high-voltage semiconductor device, comprising:
   a MOS transistor, comprising;
   a semiconductor substrate of a first conduction type;
   a well of a second conduction type, the opposite of the first conduction type, formed on the semiconductor substrate;

a body of the first conduction type, formed on the well;

a doped source of the second conduction type, formed on the body and electrically connected to the body; and a control gate formed above the body, for controlling electric connection between the doped source and the well; and a Schottky barrier diode, comprising:

a metal, functioning to be an anode of the Schottky barrier diode, contacting the well to form a Schottky barrier junction therebetween;

wherein the metal of the Schottky barrier diode does not electrically short to the doped source, so that the Schottky barrier diode blocks reverse current flowing from the doped source, via the well, to the metal.

2. The high-voltage semiconductor device as claimed in claim 1, wherein the MOS transistor comprises:

a doped drain formed on the well, wherein the doped drain electrically floats on the well.

3. The high-voltage semiconductor device as claimed in claim 2, wherein, in light of a top view, the Schottky barrier diode is formed inside a Schottky region surrounded by the doped drain.

4. The high-voltage semiconductor device as claimed in claim 2, wherein, in light of the top view, the doped drain surrounds an isolation region surrounding the Schottky region.

5. The high-voltage semiconductor device as claimed in claim 4, wherein the isolation region is a first isolation region, and the Schottky region further comprises a second isolation region surrounded by the first isolation region.

6. The high-voltage semiconductor device as claimed in claim 2, wherein, in light of a top view, at least a portion of the control gate overlaps with an isolation region, the well, the body and the doped source.

7. The high-voltage semiconductor device as claimed in claim 2, wherein, in light of a top view, the Schottky barrier diode is formed inside a Schottky region having a first doped region of the first conduction type, and the first doped region surrounds the Schottky barrier junction.

8. The high-voltage semiconductor device as claimed in claim 7, wherein, in light of a cross-sectional view, the Schottky barrier diode comprises a first doped layer of the first conduction type, buried within the well and formed under the first doped region.

9. The high-voltage semiconductor device as claimed in claim 8, wherein the first doped layer is substantially aligned with the first doped region.

10. A synchronous rectification controller in a form of an integrated circuit and in use of a power supply with a transformer and a synchronous rectification switch, wherein the transformer has a secondary winding connected in series with the synchronous rectification switch, the synchronous rectification controller comprising:

a drive node coupled to the synchronous rectification switch, wherein the synchronous rectification controller drives the synchronous rectification switch via the drive node to control electrical connection between the secondary winding and a power line;

a high-voltage node, coupled to a channel of the synchronous rectification switch; and the high-voltage semiconductor device of claim 1, wherein the high-voltage node is electrically connected to the anode, and the body to an operating voltage capacitor;

wherein the high-voltage semiconductor device is controlled to charge the operating voltage capacitor.

* * * * *